United States Patent
Anderssohn et al.

(10) Patent No.: US 9,511,509 B2
(45) Date of Patent: Dec. 6, 2016

(54) LOAD-BEARING PLATE AND METHOD FOR SUPPORTING A BULKY DEVICE OF MEDICAL ENGINEERING AND METHOD FOR PRODUCING A LOAD BEARING PLATE

(76) Inventors: Uwe Anderssohn, Warngau (DE); Hartmut Kreissig, Iserlohn (DE)

( * ) Notice: Subject to any disclaimer, the term of this patent is extended or adjusted under 35 U.S.C. 154(b) by 1063 days.

(21) Appl. No.: 13/383,719

(22) PCT Filed: Jul. 14, 2010

(86) PCT No.: PCT/EP2010/004290
§ 371 (c)(1),
(2), (4) Date: Feb. 22, 2012

(87) PCT Pub. No.: WO2011/009553
PCT Pub. Date: Jan. 27, 2011

(65) Prior Publication Data
US 2012/0138768 A1   Jun. 7, 2012

(30) Foreign Application Priority Data
Jul. 23, 2009   (DE) .......................... 10 2009 034 563

(51) Int. Cl.
*B28B 23/00*   (2006.01)
*F16F 7/108*   (2006.01)
(Continued)

(52) U.S. Cl.
CPC ........... *B28B 23/0093* (2013.01); *F16F 7/108* (2013.01); *G01R 33/28* (2013.01); *G01R 33/422* (2013.01)

(58) Field of Classification Search
CPC .......... F16F 7/108; G01R 3/28; G01R 33/422; B28B 23/0093
(Continued)

(56) References Cited

U.S. PATENT DOCUMENTS 1,778,024 A * 10/1930 Cowell .................. F16F 1/445
                                                      248/634
1,925,460 A *  9/1933 Pegram ............... B28B 19/0053
                                                      156/297
(Continued)

FOREIGN PATENT DOCUMENTS

CH          638880        10/1983
CN       201093147 Y       7/2008
(Continued)

OTHER PUBLICATIONS

The Brief Description of the Drawing of related parts of D2, which corresponds to Chinese Patent No. 201093147 and is related to U.S. Appl. No. 13/383,719.
(Continued)

*Primary Examiner* — Michael Safavi
(74) *Attorney, Agent, or Firm* — Studebaker & Brackett PC

(57) ABSTRACT

The invention relates to a load-bearing plate for supporting a bulky device of medical engineering, especially a magnetic resonance imaging device. Said load-bearing plate comprises a flat hollow body which is filled with a high-density filler, said filler being cast to give a rigid composite by means of a solidified casting compound and the hollow body as well as the filler and the casting material consist of a non-magnetic material. The invention further relates to a method for producing a load-bearing plate of the above type and to a method for supporting a bulky device of medical engineering.

16 Claims, 2 Drawing Sheets

(51) Int. Cl.
*G01R 33/28* (2006.01)
*G01R 33/422* (2006.01)

(58) Field of Classification Search
USPC ......... 248/636, 638, 678, 346.02; 108/57.12, 108/57.33, 57.25, 57.26
See application file for complete search history.

(56) References Cited

U.S. PATENT DOCUMENTS

| | | | |
|---|---|---|---|
| 3,050,426 A * | 8/1962 | Murray | B32B 27/00 188/268 |
| 3,421,326 A | 1/1969 | Vidal | |
| 5,056,341 A * | 10/1991 | Mori | D06F 39/12 206/320 |
| 5,067,348 A * | 11/1991 | Himmler | F16M 5/00 248/679 |
| 5,327,733 A * | 7/1994 | Boolchand | B01L 9/00 248/636 |
| 5,437,430 A * | 8/1995 | Welch | B29C 67/243 248/639 |
| 7,093,815 B2 * | 8/2006 | Stofiel | F16F 15/02 248/633 |
| 7,682,543 B2 * | 3/2010 | Carnevali | B29C 45/0055 248/346.06 |
| 8,776,698 B2 * | 7/2014 | Pherson | B65D 19/0002 108/51.3 |
| 2004/0079856 A1 * | 4/2004 | Whittaker | B60N 2/0232 248/678 |
| 2005/0164023 A1 * | 7/2005 | Davis | B29C 51/16 428/480 |

FOREIGN PATENT DOCUMENTS

| | | |
|---|---|---|
| DE | 3030914 | 4/1982 |
| DE | 3429883 | 4/1985 |
| DE | 3510809 | 9/1986 |
| DE | 3817458 | 11/1989 |
| DE | 4015693 | 11/1991 |
| JP | 58-137634 A | 8/1983 |

OTHER PUBLICATIONS

The relevant text passage of the first office Action issued by the State Intellectual Property Office of the People's Republic of China on May 28, 2013, which corresponds to Chinese Patent Application No. 201080033827.2 and is related to U.S. Appl. No. 13/383,719.
The second Office Action issued by the State Intellectual Property Office of the People's Republic of China on Jan. 13, 2014, which corresponds to Chinese Patent Application No. 201080033827.2 and is related to U.S. Appl. No. 13/383,719; with English language translation.
International Search Report; PCT/EP2010/004290; Mar. 4, 2011.

* cited by examiner

LOAD-BEARING PLATE AND METHOD FOR SUPPORTING A BULKY DEVICE OF MEDICAL ENGINEERING AND METHOD FOR PRODUCING A LOAD BEARING PLATE

The present invention relates to a load-bearing plate and to a method for supporting a bulky device of medical engineering, in particular a magnetic resonance imaging device. The invention also relates to a method for producing such a load-bearing plate.

When supporting bulky devices of medical engineering, in particular magnetic resonance imaging devices, numerous additional requirements have to be taken into account which do not play a part, or only play a small part when supporting conventional bulky devices, such as production machines in the industrial or commercial field.

On the one hand, this is the large weight which has to be distributed over the floor of a room of installation of the bulky device so that, where possible, it does not act purely over one specific point since medical bulky devices are not normally installed in stable machinery rooms developed specifically therefor, but instead in practice rooms which have only more limited building stability, similarly to office spaces. On the other hand, the specific type of vibrations, which are produced during operation of devices of medical engineering plays an important role.

Current development in magnetic resonance tomography leads for example to increasingly greater basic magnetic field strengths and increasingly quicker gradient systems. A greater mechanical loading of the magnets and ultimately an increased noise emission are associated with this. These emissions have to be minimised for reasons of noise control and occupational safety, and also in the interest of the patients to be examined, which is why in Germany for example, in the case of magnetic resonance tomographs, a level of 35 dB in "foreign areas" of the tomograph must not be exceeded. This is achieved by two types of measures: airborne noise is kept below the permissible thresholds by suitably reinforced insulation measures of the device, whilst structure-borne noise, which would be transmitted from the device to the floor of the room of installation, is absorbed by complex decoupling mechanisms. In this instance load-bearing plates which have a high level of inherent rigidity and a high natural weight of at least 1.8 to 2 tonnes are used.

In contrast to load-bearing plates for most conventional commercial bulky devices, the load-bearing plates used have to satisfy further criteria which are now associated with considerable time and/or cost outlay during production:

The overall height of load-bearing plates is an important factor, since bulky devices of medical engineering are designed to be installed at a specific height at which a patient can be comfortably positioned. In addition, the bulky devices are also to be installed in rooms having current conventional room height dimensions, for example in doctors' surgeries. Since the bulky device itself requires room heights between approximately 235 cm and 270 cm depending on the design, the space for a load-bearing plate is very limited. In doctors' surgeries, heights between the bare floor and the bare ceiling of less than 300 cm are often to be found, wherein up to 25 cm of room height are also lost owing to static reinforcements for the bulky device.

On the other hand, a considerable magnetic field emission is associated with the operation of bulky devices of medical engineering, in particular of magnetic resonance imaging devices, wherein magnetic interfering influences in the surroundings of the magnet must also simultaneously be prevented from playing any role. For example, the iron plates normally used as load-bearing plates in commercial machines therefore cannot be used, since their magnetic interfering influences would distort the homogeneous basic magnetic field of the magnetic resonance device in such a way that it would be impossible to carry out qualitative, high-quality imaging.

For supporting conventional machines, DE 35 10 809 A1 proposes a sound damping means which makes it possible to support heavy machines, for example compressors and large internal combustion engines, with twice the amount of resilience. For this purpose, an intermediate element in the form of a load-bearing plate is used, which is filled with lead shot, in addition to various cushioning spring elements with point-elastic support. Owing to such a filling with lead shots, a greater overall weight can be achieved, but there is the risk that the lead shot will be displaced back and forth by the actual vibrations to be cushioned. As a result, subsequent shifts in the weight of the lead shot may be produced which are to be avoided at all costs, however, in the case of sound insulation. Currently, either high-grade steel plates or cast concrete load-bearing plates are therefore used as load-bearing plates for bulky devices of medical engineering.

Since the transport of an individual high-grade steel block having a mass of 1.8 tonnes is not generally possible within a building, a plurality of large-area plates are screwed together on site to form a block. Since these plates generally have to be approximately 1 cm thick for reasons of mechanical strength, they still have a high weight, according to experience, of at least 160 kg. In addition, with plates having a weight of 160 kg only a relatively low level of mechanical rigidity is provided. In particular, a design with high-grade steel plates poses the drawback of considerable additional costs compared to iron plates.

The use of a load-bearing plate made of concrete or baryta concrete is also associated with considerable drawbacks. Firstly, the load-bearing plate is much thicker (approximately 12 to 18 cm) owing to the lower density of concrete compared to high-grade steel. Secondly, before the load-bearing plate is cast, a high-frequency shielding has to be installed, that is to say generally cast, on site over the floor of the room of installation and, if necessary further structural layers have to be applied thereto, on which the load-bearing plate is then assembled. These structural procedures have to be split over time, and therefore there is an additional time outlay which is thirdly increased considerably further by the long drying time of the concrete.

Based on this, the object of the invention is to provide an improved option for supporting bulky devices of medical engineering with use of a load-bearing plate. The improvement is to consist preferably in a reduction in cost of the production process and/or in the shortening of production times, wherein the stability of the load-bearing plate is to remain at least the same compared to the prior art.

This object is achieved by a load-bearing plate and by a production method.

A load-bearing plate according to the invention for supporting a bulky device of medical engineering, in particular a magnetic resonance imaging device accordingly comprises a flat hollow body which is filled with a high-density filler, wherein the filler is cast to give a rigid composite by means of a solidified casting material and the hollow body as well as the filler and the casting material consist of non-magnetic material.

The invention thus makes use of a filled flat hollow body with a filler, which is bonded to give a solid composite by means of a casting material. A receiving device which is greater in terms of width and depth than in terms of height is understood to be a flat hollow body. The direction in space which extends with an intended arrangement of the load-bearing plate from the floor of a room of installation towards the bulky device to be installed is understood to be height.

The filler has a high level of density, wherein this is to be understood to mean that its density lies above that of concrete in any case, that is to say above 2500 kg/m$^3$, preferably above 5000 kg/m$^3$, more preferably above 10000 kg/m$^3$. It is thus possible to considerably reduce the overall height of the load-bearing plate compared to concrete, and even compared to the overall height of iron or high-grade steel load-bearing plates with a density above 10000 kg/m$^3$.

The form in which the filler is supplied is, in principle, variable depending on the place of use of the load-bearing plate. For example, thin material plates can be used which preferably have a thickness below 10 mm, more preferably below 5 mm. In contrast to the high-grade steel plates according to the prior art, thinner plates are thus preferably used, in addition more preferably made of a more dense material. Alternatively, a rolled material may also be used.

This filler is cast, that is to say bonded, to form a composite by means of a casting material. This is thus a type of adhesive bond between the individual components of the filler, which permanently ensures a fixed bond between hollow body and filler as well as within the filler itself once the casting material has solidified. This thus provides a similar effect to that of a design in one piece of a load-bearing plate made of one material, specifically the formation of a compact unit as a load-bearing plate, but avoids all the above-mentioned drawbacks during the production of load-bearing plates made of individual high-grade steel plates or of cast concrete. The individual components of the load-bearing plate according to the invention may be brought to the site at will and assembled there. The difficulties according to the prior art, in particular of the high transport outlay owing to the large masses are thus omitted. A very important advantage of the load-bearing plate according to the invention is, in addition to this possibility for simplified production, the fact that the filler forms a compact plate after the casting process compared to the prior art in DE 35 10 809 A1 and the decoupling of structure-borne noise, as is typically emitted by bulky devices of medical engineering, functions considerably better than in multi-part damping counterweights. The compact unit in the form of a stable composite is thus ideally useable in the scope of a mass-spring system for supporting bulky devices of medical engineering.

Even if concrete were again used as a casting material, which is not explicitly ruled out within the scope of the invention, the drying times would, however, be reduced considerably by the filler. It is therefore particularly preferable within the scope of the invention for the filler to fill a volume fraction of more than half the content of the hollow body, more preferably more than 80%.

The hollow body as well as the filler and casting material consist of non-magnetic material. This means that it is a non-magnetisable material, that is to say a non-ferromagnetic or only negligibly ferromagnetic material. The threshold of the magnetisability is not normally given in this instance in absolute values of the magnetic flux, but is instead defined from the iron mass used per m$^2$ of installation area in relation to the necessary distance between the isocentre of a bulky device of medical engineering, in particular a magnetic resonance device, and the load-bearing plate. For example, in the case of the magnetic resonance devices by Siemens: "Magnetom Trio" (basic magnetic field strength 3.0 Tesla), "Magnetom Verio" (basic magnetic field strength 3.0 Tesla), "Magnetom Avanto" (basic magnetic field strength 1.5 Tesla) and "Magnetom Espree" (basic magnetic field strength 1.5 Tesla), a static iron mass of 100 kg/m$^2$ of all structural iron masses including the load-bearing plate below the base of the magnet must not be exceeded. Owing to an appropriate material selection, it can be ensured that no magnetic interfering fields are produced by the load-bearing plate, it being possible for example that these could influence a magnetic resonance imaging device in an image-distorting manner.

This embodiment of a heavy, highly stable load-bearing plate, which may also have a low structural height, can be used universally for different types of bulky devices of medical engineering, in particular different magnetic resonance imaging devices, and can in principle also be used in other fields of application for the decoupling of structure-borne noise. Owing to its specific non-magnetic and highly stable design, it is most preferably suitable and provided for magnetic resonance imaging devices, however.

A corresponding method for producing a load-bearing plate for supporting a bulky device of medical engineering, in particular a magnetic resonance imaging device, comprises at least the following steps:

a) providing a flat hollow body made of non-magnetic material, b) filling the hollow body with a high-density non-magnetic filler, c) casting the filler to give a rigid composite by means of a solidifying casting material.

The filling of the hollow body and the casting, that is to say bonding, of the filler are preferably carried out at the place of use of the load-bearing plate, since the above-mentioned handling advantages of the production method according to the invention are particularly effective for this purpose. Assembly may be carried out at the same time as the preparation of the high-frequency shielding, and the load-bearing plate can be subjected to loading within 12 to 24 hours with the use of suitable materials (see below). In addition to these advantages, there is also an enormous cost saving owing to the reduced processing times and the much lower material costs, for example compared to an embodiment of the load-bearing plate formed purely of high-grade steel plates. Individual sub-steps, in particular sub-steps in the case of production of the flat hollow body may also be carried out before delivery to the place of use, however. These include, for example, shaping steps and other finishing steps for production of the flat hollow body.

The method according to the invention for supporting a bulky device of medical engineering, in particular a magnetic resonance imaging device, in a place of use of the bulky device comprises at least the following steps:

a) providing a flat hollow body made of non-magnetic material, b) filling the hollow body on site with a high-density non-magnetic filler, c) casting the filler on site to give a rigid composite by means of a solidifying casting material so that a load-bearing plate is produced from the hollow body with the rigid composite, d) installing the medical bulky device on the load-bearing plate.

The support method thus also includes, in addition to the steps of the production method, the installation of the bulky device on the load-bearing plate produced in accordance with the invention.

The invention further comprises a support assembly having a load-bearing plate arranged on a surface of a floor of a room for installation. Such a support assembly may in particular comprise, as mentioned below, further support elements for supporting a bulky device.

The invention also includes the use of a load-bearing plate according to the invention, in particular a support assembly according to the invention, for supporting a bulky device of medical engineering, in particular a magnetic resonance imaging device.

In addition, the invention relates to an assembly of medical engineering, comprising a bulky device of medical engineering, in particular a magnetic resonance imaging device, and a load-bearing plate according to the invention, in particular a support assembly according to the invention.

Further, particularly advantageous embodiments and developments of the invention will emerge from the dependent claims and from the following description. The claims of one category may also be developed in accordance with the dependent claims of another category.

The hollow body particularly preferably comprises a trough. This may be open or closed upwardly, that is to say in the direction of the bulky device, in the end state of the loading plate or before finishing of the load-bearing plate. In particular, a receptacle comprising at least one recess is understood to be a trough. The recess is preferably an individual recess which extends over the entire width and the entire depth of the trough, with the exception of lateral and rear and front delimiting walls. These delimiting walls are preferably at most three times greater in terms of thickness than the height of the trough in the region of the recess, and they are more preferably basically as thick as the height of the trough in the region of the recess. However, in specific cases the recess of the trough and the thickness dimensions of its lateral and rear and front delimiting walls may also be dimensioned differently, for example with use of round or irregular recess shapes. It may also be advantageous to form the trough with a plurality of recesses which are preferably arranged in a uniform pattern in relation to one another. Such an arrangement and embodiment of the recesses may provide advantages in particular by increasing the overall stability of the load-bearing plate.

In accordance with an advantageous development, the load-bearing plate comprises a cover covering the trough, at least in part, in the opening direction. The opening direction is defined as the vertical direction to the bulky device to be installed. Such a cover may close the load-bearing plate upwardly so that it constitutes a closed overall composite, into which no particles can penetrate from the outside and, for example, moisten the casting material. The cover may be connected rigidly to the residual composite of the load-bearing plate by means of the casting material, or other, long-known connection types such as rivets, screws, adhesive bonding and the like may be selected. The cover may also close the trough loosely and, in addition to sealing the interior of the trough, also provides a more aesthetically appealing look of the load-bearing plate, for example when used in doctors' surgeries, where an upwardly open trough filled with casting compound would be considered to be objectionable and a covering is enclosed for example by an adapted floor coating.

For further mechanical stabilisation of the load-bearing plate in the direction of width and/or depth, at least one stabilising support may be arranged in or on the hollow body in accordance with a preferred embodiment. Such transverse and/or longitudinal or diagonal bracings are also used to further stabilise the filler. For example, they may be formed as square pipes or round pipes, but also as U-shaped braces, L-shaped braces, T-shaped braces, H-shaped braces or similar supports. They may be arranged both inside the hollow body and adjacent, preferably laterally adjacent, more preferably peripherally laterally adjacent. It is particularly advantageous that the stabilising support is also made of non-magnetic material so as also rule out magnetic interfering fields in this instance.

It has also proven to be advantageous if the hollow body and, if provided, the stabilising support(s) consist at least predominantly of high-grade steel, since this is a standard material which is particularly simple to produce, is non-magnetic within the meaning of the above definition and has been proven to exhibit a high level of strength, as already demonstrated in the prior art.

With regard to the filler, it is preferred if it contains a bulk material or if it is a bulk material, for example a granulate or a fine- or coarse-grained material. Silica sand or lead shot are particularly advantageous for this purpose, since they are both comparatively dense and are non-magnetic within the meaning of the above-definition. Such a bulk material may be transported anywhere, virtually without any specific effort, and then filled into the hollow body on site.

In particular with lead—in the form of bulk material or in another form, such as a roll—an extremely low structural height of only 35 mm or even less depending on the specific embodiment can be achieved owing to its high density, even for a load-bearing plate of at least 1.8 tonnes.

The casting material preferably comprises a cast resin, for example a UV-curing resin such as an epoxy resin, which is runny during casting or a multi-component resin, which cures a plurality of combined individual components by chemical and/or physical reactions. Cast resins are generally also non-magnetic and, owing to their sufficiently good viscosity properties, can be easily cast in the hollow body, where they may also penetrate into small cavities. They may also cure rapidly and in a stable manner and offer good cohesion properties during the formation of the composite with filler. An easily controllable casting process can thus be ensured, which is associated with a relatively low time outlay.

It is further preferred for the casting material to comprise a material which is already in a liquid or semi-liquid state at room temperature before the solidification. The casting material can thus be introduced into the hollow body without the use of melting or other liquefying processes under normal ambient conditions in rooms of installation for such load-bearing plates.

With regard to the support assembly, it is advantageous if the load-bearing plate is embedded in the surface of the floor, wherein it is particularly preferably arranged with its upper face facing the bulky device of medical engineering basically level with a surface of the floor, that is to say a resting surface of the floor around an, installation cavity, or even therebeneath. It is thus ensured that the floor acts as an additional stabilising element which delimits and holds the load-bearing plate in the direction of its expansion of width and depth. At the same time, a yet smaller overall height of the load-bearing plate is thus achieved, and therefore the room height of the room of installation can be utilised in an optimal manner.

In accordance with a preferred embodiment the support assembly is characterised in that it comprises resilient spring elements on the upper face of the load-bearing plate facing the bulky device of medical engineering which re locally separated, that is to say from one another. The positions of these spring elements preferably correspond to positions of standing legs of the bulky device. A point-elastic support of the standing legs is thus achieved, which in itself absorbs a series of vibrations, for example in the higher wavelength range, of the bulky device. In addition to conventional springs, such as spiral springs, such spring elements may also include resilient foam materials. It is alternatively possible to provide a planar spring system on the upper face, which is contact with the load-bearing plate over a large area, that is to say covers at least ¼ of the surface of the upper face of the load-bearing plate.

It is particularly preferred if at least one of the spring elements comprises components of different spring force. A wide spectrum of vibration frequencies can thus be absorbed.

The support assembly on which the underside, remote from the bulky device of medical engineering, of the load-bearing plate comprises a resilient spring system is appropriate. This is preferably basically formed so as to be completely planar, that is to say for example it may be formed as a one-piece insulation layer and its expansion in width and depth basically corresponds to that of the load-bearing plate. The spring effect of this resilient spring system is preferably matched to any resilient spring elements provided and cushions the bulky device and the load-bearing plate, and therefore ultimately the entire assembly of medical engineering, against the substrate of the floor.

A particularly preferred embodiment of the support assembly lastly consists in the fact that it comprises a high-frequency shielding layer to shield against electromagnetic radiation. This layer filters the electromagnetic frequencies generated by the bulky device in such a way that a "high-frequency cabin" is produced in the room of installation and adjacent rooms are not exposed to the emitted electromagnetic signals or interferences, or at most are only exposed slightly thereto. In addition, the measuring system for example of a magnetic resonance imaging device is thus not affected externally, or at most only to a slight extent, by high frequencies. The high-frequency shielding is preferably more than 90 dB in the measuring range.

The invention will be described hereinafter in greater detail once again with reference to the accompanying figures on the basis of one embodiment. Like components are each provided in the different figures with the same reference numerals. In the drawings.

Figure 1:
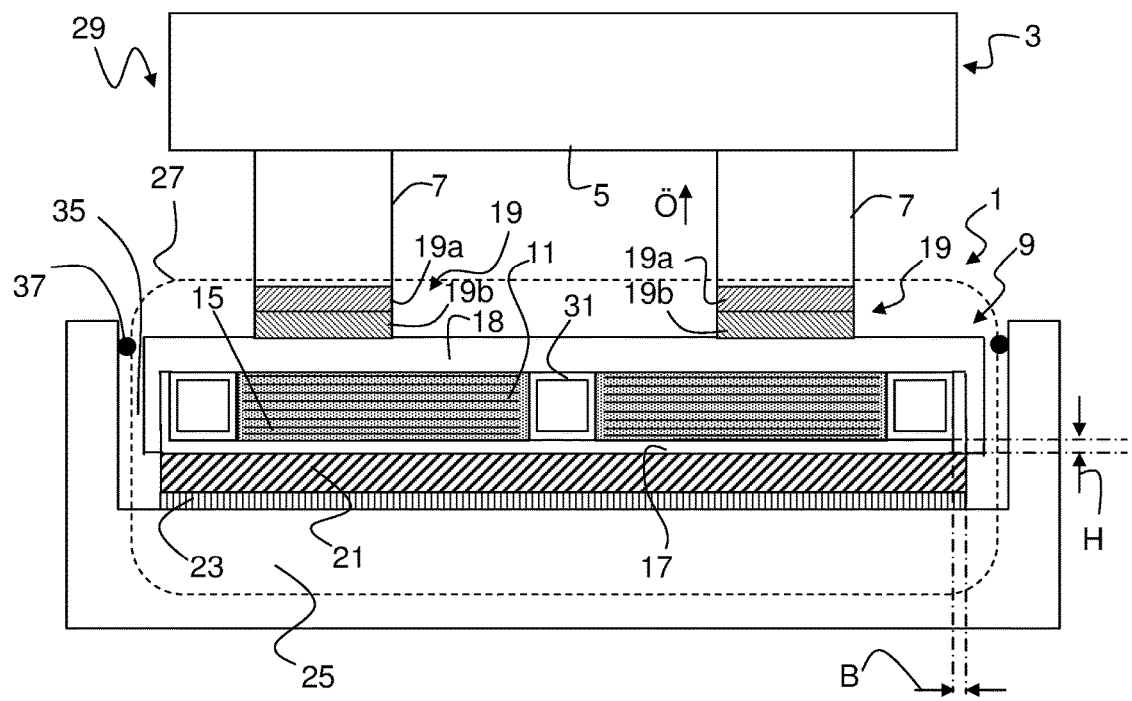
FIG. 1 is a sectional view of an embodiment of an assembly of medical engineering comprising a load-bearing plate according to the invention in accordance with a first embodiment.

FIG. 1 shows an exemplary assembly 29 of medical engineering according to the invention on a floor 25 of a room for installation. The assembly 29 of medical engineering comprises a bulky device 3 of medical engineering in the form of a magnetic resonance imaging device, which in this case is indicated schematically by a magnet 5 and two standing legs 7, as well as an exemplary support assembly 27 according to the invention.

The support assembly 27 comprises a load-bearing plate 1 according to the invention in accordance with a first embodiment as well as two resilient spring elements 19, on the upper face of the load-bearing plate 1, comprising components 19a, 19b which have different spring force. In addition, a resilient spring system 21 and a high-frequency shielding layer 23 are arranged on the underside of the load-bearing plate 1. The spring constants of the components 19a, 19b are selected in relation to the weight of the load-bearing plate 1 or of the bulky device 3 or of both in combination in such a way that a wide frequency spectrum of the structure-borne noise of the bulky device 3 is absorbed.

The load-bearing plate 1 comprises a hollow body 9 which is formed of a trough 17 and a cover 18. A plurality of stabilising supports 31 in the form of square pipes as well as a filler 11, in this case in the form of thin material plates, for example made of lead, are located inside the hollow body 9. To form a composite, a casting material 15 is additionally introduced which, when cured, causes cohesion and adhesion of the filler 11 within itself and with the stabilising supports 31, the trough 17 and the cover 18. The cover 18 closes the trough 17 in the opening direction Ö towards the bulky device 3 of medical engineering. The trough 17 has a height H at its underside and a width B at its side walls which are basically of equal dimension, that is to say the base wall and the side walls are equally thick.

Owing to the use of the casting material 15, it can be ensured that the load-bearing plate 1 constitutes a stable block which acts as a mass and therefore as a counterweight to the bulky device 3. The components 19a, 19b of the resilient spring elements 19 cushion, with point-elastic support, specific higher mechanical vibration frequencies in relation to the load-bearing plate 1, whereas lower structure-borne noise frequencies are transferred onto the load-bearing plate 1 and are absorbed thereby owing to its resilient support. An additional vibration compensation is ensured by the formation of the resilient spring system 21 over the entire area on the underside of the load-bearing plate 1. The high-frequency shielding layer 23 shields against the electromagnetic high-frequency radiation so that the surrounding environment is not affected by the bulky device 3, and the bulky device 3 is not considerably affected externally by high-frequency radiation.

The load-bearing plate 1 is embedded in a cavity 35 in the floor 25 so that its surface lies slightly below the rest of the surface of the floor 25 outside the region of the cavity 25. Owing to a recessed support, this support also possibly being flush with the surface of the floor 25, the overall height of the support assembly 27 is again reduced or compensated for completely. Rubber joins 37 are also incorporated peripherally around the load-bearing plate 1 to seal the load-bearing plate 1 against the floor 25, and therefore a flowing transition between the surface of the floor 25 and the load-bearing plate 1 can be ensured.

Figure 2:
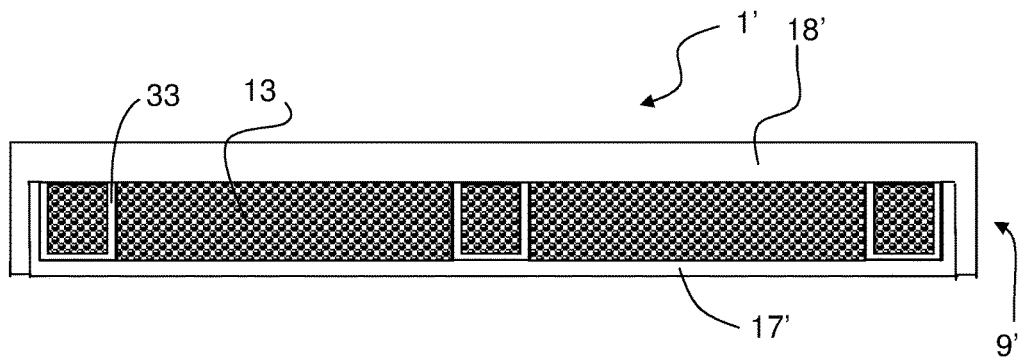
FIG. 2 is a sectional view of a second embodiment of a load-bearing plate according to the invention.

FIG. 2 shows a second embodiment of a load-bearing plate 1'. As in FIG. 1, it can be used within the scope of a support assembly but, just like the load-bearing plate from FIG. 1, it can also be used merely to support a bulky device of medical engineering (not shown in this instance).

The load-bearing plate 1' again comprises a hollow body 9' with a trough 17' and a cover 18'. The difference from the load-bearing plate 1 from FIG. 1 basically consists in the fact that a bulk material in the form of lead shot or silica sand is now used as a filler 13. This is again filled together with a casting material (not indicated in this instance for reasons of clarity) so that a composite is again formed. Rectangular U-shaped supports are used as a stabilising supports 33 and in this case are advantageously open towards the upper face of the load-bearing plate so that they are also filled with filler 13 and casting material.

Figure 3:
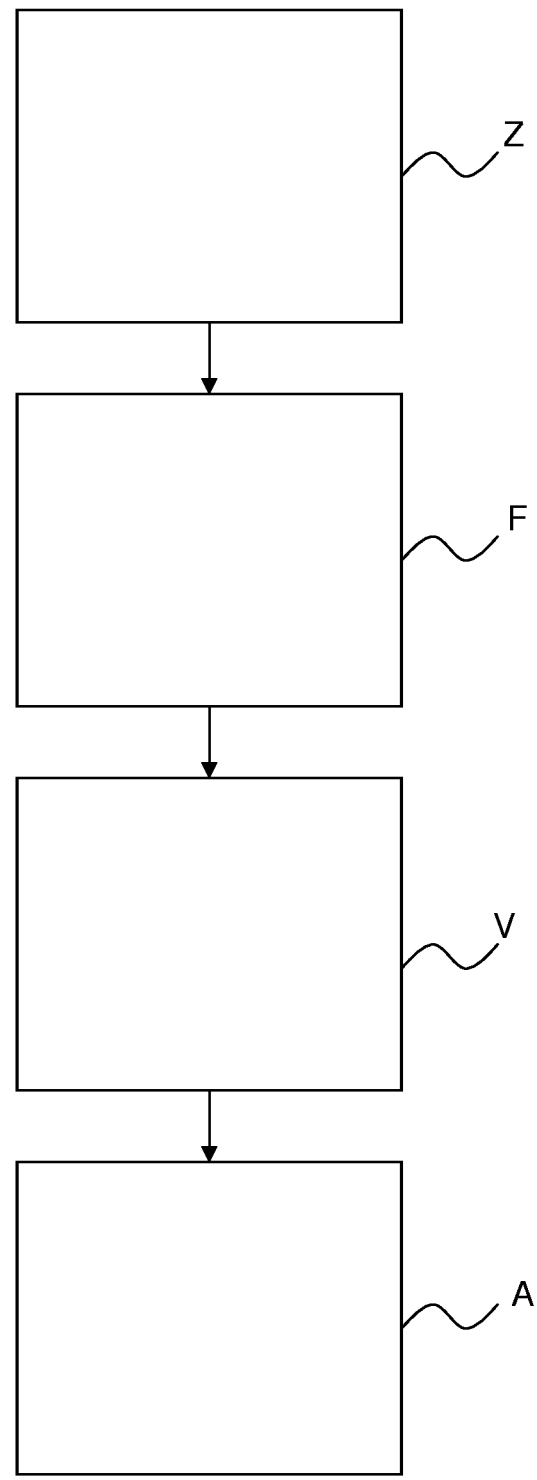
FIG. 3 is a schematic block diagram of an embodiment of a production method according to the invention and, as it continues, of a support method according to the invention.

FIG. 3 shows a schematic view of the course of an embodiment of a production method according to the invention and—as it continues—of a method according to the invention for supporting a bulky device of medical engineering.

In a step Z, a flat hollow body 9, 9' made of non-magnetic material is provided, for example in trough form. It may be supplied as a one-piece part or assembled from a plurality of parts, for example by welding on site.

Before the hollow body 9, 9' is installed, the floor 25 of the room of installation is preferably prepared. For this purpose, a cavity 35 may be formed therein, for example by being milled out. A high-frequency shielding layer 23 and, thereabove, a resilient spring system 21 are preferably applied to the floor. The hollow body 9, 9' is now arranged on this or on a similar structure.

In a step F it is filled with a non-magnetic filler 11, 13. The filler 11, 13 is then cast in a step V to give a rigid composite by means of a solidifying casting material 15. This entire structure may be closed, for example, by applying a cover 18. The load-bearing plate 1, 1' is produced from step F so that the production method comprises these first three steps. Further resilient spring elements 19 may additionally be applied to the upper face of the load-bearing plate 1, 1'. The support method then also includes the installation A of the bulky device 3 of medical engineering on the load-bearing plate 1, 1'.

To conclude, it is lastly noted that the devices described above are merely exemplary embodiments which may be modified in a wide range of manners by a person skilled in the art without departing from the scope of the invention. In particular, the load-bearing plate may be formed in a simpler manner, and for example filled with only one filler and one casting material. On the other hand, the support assembly may also comprise fewer or more spring systems. The use of the indefinite article "a" or "an" also does not rule out the possibility that the relevant features may also be provided in multiple.

LIST OF REFERENCE NUMERALS 1, 1' load-bearing plate
3 bulky device of medical engineering
5 magnet
7 standing legs
9, 9' hollow body
11 filler—material plates
13 filler—bulk material
15 casting material
17, 17' trough
18, 18' cover
19 resilient spring elements
19a, 19b components
21 resilient spring system
23 high-frequency shielding layer
25 floor
27 support assembly
29 assembly of medical engineering
31 stabilising support—square pipe
33 stabilising support—U-shaped support
35 cavity
37 rubber join
A method step—installing
B width
F method step—filling
H height
Ö opening direction
V method step—casting
Z method step—providing

The invention claimed is:

1. A method for supporting a bulky device of medical engineering at a place of use of the bulky device, said method comprising the following steps:
    a) providing a flat hollow body made of non-magnetic material,
    b) filling the hollow body on site with a high-density non-magnetic filler, wherein a density of the filler is higher than 2500 kg/m$^3$,
    c) casting the filler on site to give a rigid composite by means of a solidifying casting material so that a load-bearing plate is produced from the hollow body with the rigid composite, and
    d) installing the medical bulky device on the load-bearing plate.

2. The method according to claim 1, wherein the hollow body comprises a trough.

3. The method according to claim 2, the load-bearing plate further comprising a cover covering the trough, at least in part, in the opening direction.

4. The method according to claim 1, wherein a stabilizing support made of non-magnetic material is arranged in or on the hollow body.

5. The method according to claim 4, wherein the hollow body and/or the stabilizing support comprises at least predominantly of high-grade steel.

6. The method according to claim 1, wherein the filler comprises a bulk material.

7. The method according to claim 1, wherein the casting material comprises a cast resin.

8. The method according to claim 1, wherein the casting material comprises a material which has a liquid or semi-liquid state before solidification at room temperature.

9. The method according to claim 1, wherein a support assembly comprising the load-bearing plate is arranged on a surface of a floor of a room of installation.

10. The method according to claim 9, wherein the load-bearing plate is embedded in the surface of the floor.

11. The method according to claim 10, wherein the load-bearing plate is arranged with an upper face of the load-bearing plate facing the bulky device of medical engineering substantially level with a surface of the floor or beneath the surface of the floor.

12. The method according to claim 9, wherein the load-bearing plate is used for the support assembly to support the bulky device of medical engineering, wherein the bulky device of medical engineering is a magnetic resonance imaging device.

13. The method according to claim 9, wherein the bulky device of medical engineering is a magnetic resonance imaging device, and
    wherein an assembly of medical engineering comprises the magnetic resonance imaging device, the load-bearing plate and the support assembly.

14. The method of claim 1, wherein the method comprises a method for producing the load-bearing plate for supporting a magnetic resonance imaging device, said method for producing the load-bearing plate comprising the steps a), b) and c).

15. The method according to claim 1, the method comprising the load-bearing plate for supporting the bulky device of medical engineering, wherein the bulky device of medical engineering is a magnetic resonance imaging device, the load-bearing plate comprising the flat hollow body which is filled with the high-density non-magnetic filler, the filler being cast to give the rigid composite by means of the solidifying casting material and the hollow body as well as the filler and the casting material comprising non-magnetic material.

16. The method according to claim 1, wherein the bulky device of medical engineering is a magnetic resonance imaging device.

\* \* \* \* \*